US012721086B2

(12) United States Patent
Maji

(10) Patent No.: US 12,721,086 B2
(45) Date of Patent: Aug. 25, 2026

(54) HOLDING TABLE

(71) Applicant: DISCO CORPORATION, Tokyo (JP)

(72) Inventor: Ryogo Maji, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 293 days.

(21) Appl. No.: 18/462,806

(22) Filed: Sep. 7, 2023

(65) Prior Publication Data

US 2024/0105471 A1 Mar. 28, 2024

(30) Foreign Application Priority Data

Sep. 26, 2022 (JP) ................................ 2022-152699

(51) Int. Cl.

*H10P 72/00* (2026.01)
*B23K 26/38* (2014.01)
*B23K 26/40* (2014.01)
*B23K 101/40* (2006.01)
*B23K 103/00* (2006.01)

(52) U.S. Cl.

CPC .......... *H10P 72/0428* (2026.01); *B23K 26/38* (2013.01); *B23K 26/40* (2013.01); *B23K 2101/40* (2018.08); *B23K 2103/52* (2018.08)

(58) Field of Classification Search

CPC ........ H01L 21/67092; H01L 21/68757; B23K 26/38; B23K 26/40; B23K 2101/40; B23K 2103/52; B23K 37/0408; B65G 49/07

See application file for complete search history.

(56) References Cited

U.S. PATENT DOCUMENTS 11,848,223 B2 * 12/2023 Kugimoto ........... H01L 21/6833
2016/0002110 A1 * 1/2016 Izumi ...................... C04B 35/12 156/89.28
2017/0117175 A1 * 4/2017 Katsuda ................ C04B 37/006
2020/0135529 A1 * 4/2020 Shiraishi ........... H01L 21/67109
2020/0185203 A1 * 6/2020 Lubomirsky ....... C23C 16/4586
2022/0415629 A1 * 12/2022 Koiwa .............. H01J 37/32568
2023/0154780 A1 * 5/2023 Takabatake ....... H01L 21/68757 361/234

FOREIGN PATENT DOCUMENTS

JP 2001-172090 A 6/2001
JP 2010-235394 A 10/2010
JP 2011014783 A 1/2011

OTHER PUBLICATIONS

Office Action issued in counterpart Japanese Patent Application No. 2022-152699, dated Apr. 21, 2026.

* cited by examiner

*Primary Examiner* — Fernando L Toledo
*Assistant Examiner* — Marshall Mu-Nuo Hatfield
(74) *Attorney, Agent, or Firm* — GREER BURNS & CRAIN, LTD.

(57) ABSTRACT

A holding table includes a holder made of porous ceramic and configured to hold a workpiece thereon. The holder contains an oxide semiconductor. The holder has a volume resistivity in the range of $1\times10^{-8}$ to $1\times10^{-6}$ Ω·m. The oxide semiconductor is in the range of 3% by volume to 20% by volume in terms of a blending ratio. The oxide semiconductor includes tin oxide, titanium oxide, nickel oxide, or zinc oxide.

6 Claims, 5 Drawing Sheets

HOLDING TABLE

BACKGROUND OF THE INVENTION

Field of the Invention

The present invention relates to a holding table for holding a workpiece thereon.

Description of the Related Art

When a workpiece including small devices such as integrated circuits (ICs) or large-scale integrated (LSI) circuits is held on a holding table and processed, inspected, and cleaned, for example, the workpiece on the holding table tends to be electrostatically charged, possibly causing electrostatic breakdown of the devices. In view of the drawback, there has been proposed a holding table that is rendered electrically conductive by adding metal particles of zirconia, cobalt, or the like to porous ceramic that is to be sintered into the holding table (see, for example, JP 2011-014783A).

SUMMARY OF THE INVENTION

However, when the porous ceramic containing the metal particles is sintered in the atmosphere, the metal particles are oxidized and become less electrically conductive, with the result that the resistivity of the porous ceramic may not be lowered to a desired value.

It is therefore an object of the present invention to provide a holding table made of porous ceramic whose resistivity can be lowered to a desired value even though it is sintered in the atmosphere.

In accordance with an aspect of the present invention, there is provided a holding table that includes a base having a circular cavity defined therein and a holder fitted in the circular cavity in the base, in which the holder contains porous ceramic and an oxide semiconductor.

Preferably, the holder has a volume resistivity in the range of $1\times10^{-8}$ to $1\times10^{-6}$ Ω·m, and the oxide semiconductor has a blending ratio in the range of 3% by volume to 20% by volume.

Preferably, the oxide semiconductor includes at least any of tin oxide, titanium oxide, nickel oxide, or zinc oxide.

Preferably, the oxide semiconductor includes the tin oxide, and the tin oxide has a blending ratio in the range of 3% by volume to 10% by volume.

Preferably, the oxide semiconductor includes the titanium oxide or the nickel oxide, and the titanium oxide or the nickel oxide has a blending ratio in the range of 10% by volume to 20% by volume.

According to the present invention, the resistivity can be lowered to a desired value even when the holder is sintered in the atmosphere.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
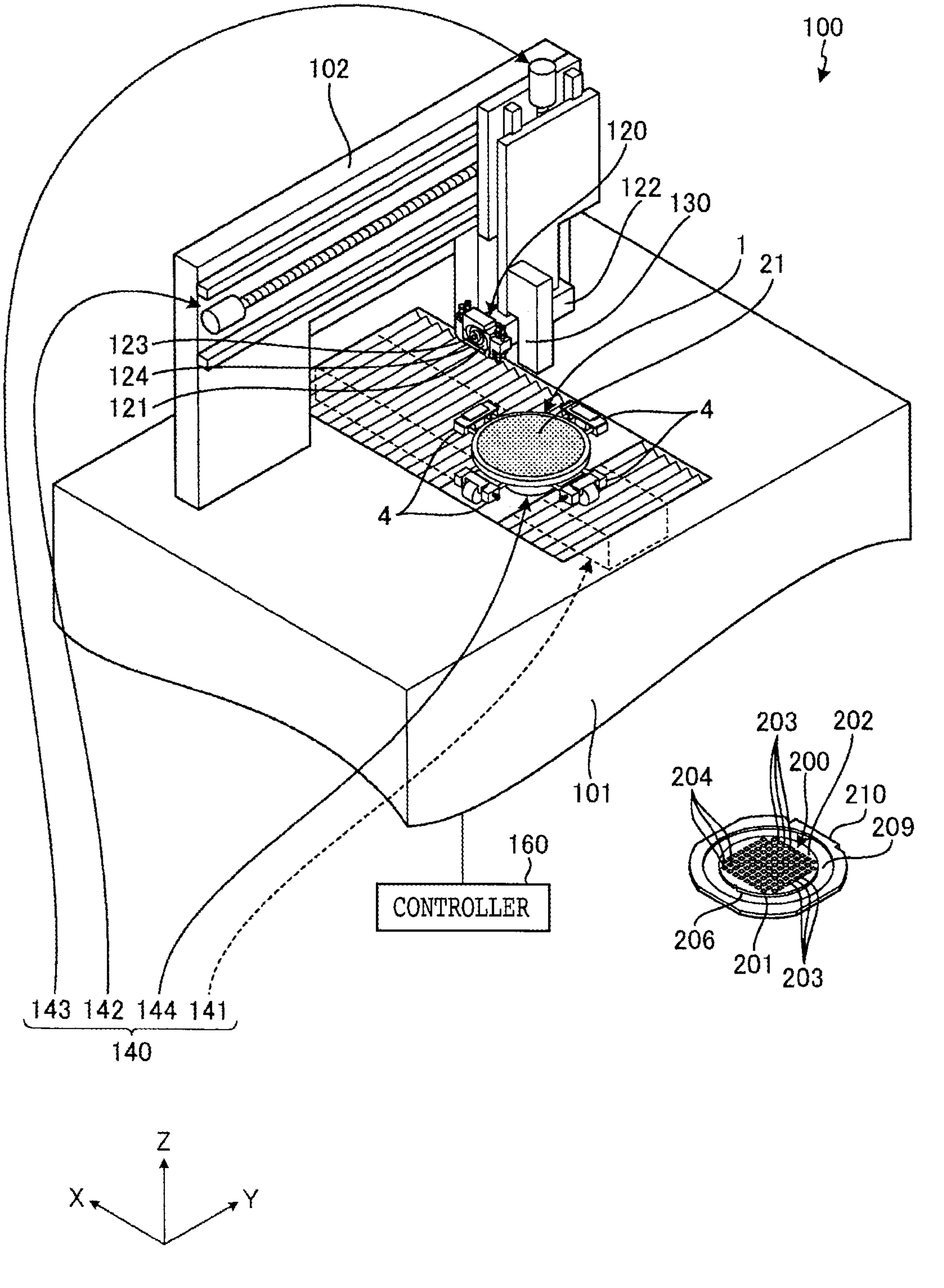
FIG. 1 is a perspective view illustrating a structural example of a processing apparatus incorporating a holding table according to an embodiment of the present invention.

A preferred embodiment of the present invention will be described hereinbelow with reference to the accompanying drawings. The present invention is not limited to the details of the embodiment described below. The components described below cover those which could easily be anticipated by those skilled in the art, and those which are essentially identical to those described below. Further, the arrangements described below can be combined in appropriate manners. Various omissions, replacements, or changes of the arrangements may be made without departing from the scope of the present invention. In the description below, those components that are identical to each other are denoted by identical reference characters.

Figure 2:
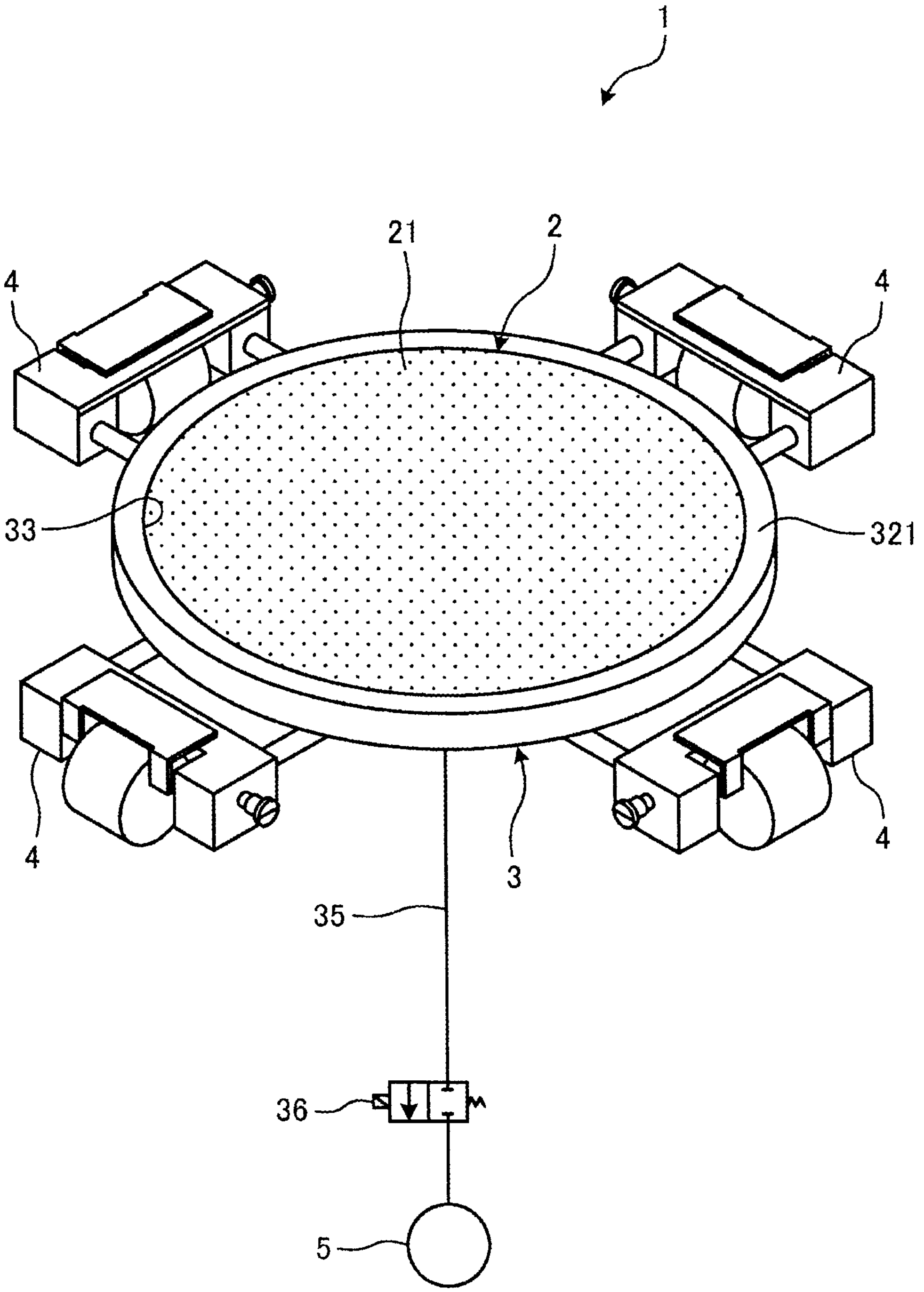
FIG. 2 is a perspective view illustrating a structural example of the holding table according to the embodiment.
Figure 3:
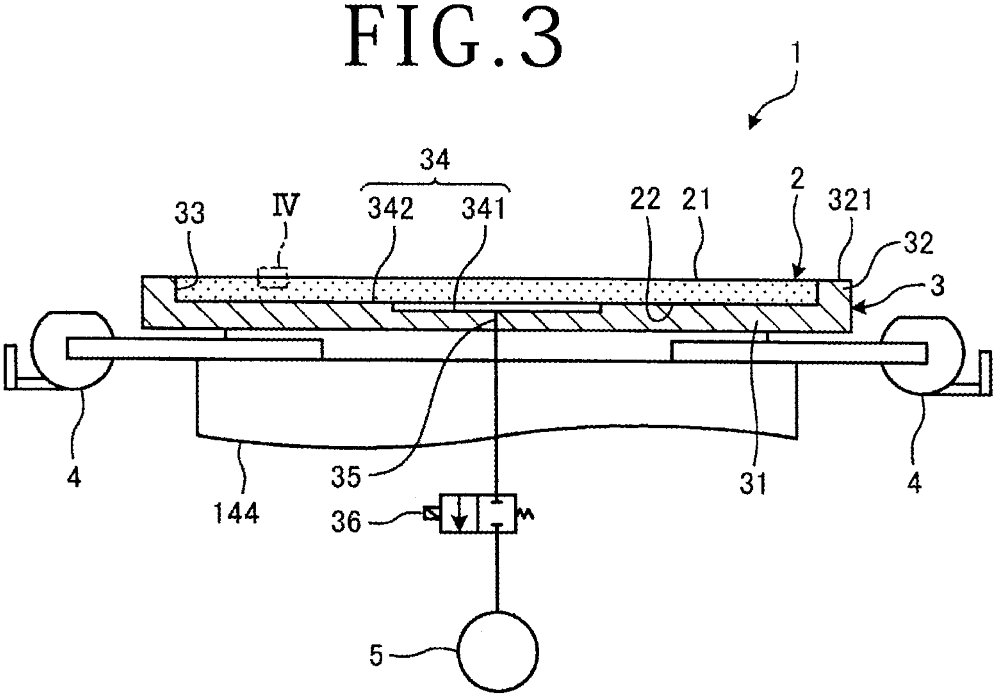
FIG. 3 is a side elevational view, partly in cross section, of the holding table illustrated in FIG. 2.

A holding table according to the present embodiment will be described below with reference to the drawings. FIG. 1 illustrates, in perspective, a structural example of a processing apparatus incorporating the holding table, denoted by 1, according to the present embodiment. FIG. 2 illustrates, in perspective, a structural example of the holding table 1 according to the embodiment. FIG. 3 illustrates the holding table 1 in side elevation, partly in cross section.

As illustrated in FIG. 1, the holding table 1 according to the present embodiment is incorporated in the processing apparatus, denoted by 100. The processing apparatus 100 illustrated in FIG. 1 represents a cutting apparatus for cutting a workpiece 200 held on the holding table 1. The workpiece 200 to be processed by the processing apparatus 100 represents a wafer such as a semiconductor wafer or an optical device wafer that is shaped as a circular plate and that includes a substrate 201 made of silicon, sapphire, gallium, or the like.

The workpiece 200 has a plurality of devices 204 constructed in respective areas demarcated on a face side 202 of the workpiece 200 by a grid of projected dicing lines 203 established thereon. The devices 204 may be ICs, LSI circuits, charge-coupled device (CCD) image sensors, complementary-metal-oxide-semiconductor (CMOS) image sensors, or various memories such as semiconductor storage devices, for example.

According to the present embodiment, a circular adhesive tape 209 that is larger in diameter than the workpiece 200 has an outer edge portion affixed to an annular frame 210. The workpiece 200 is placed in an opening of the annular frame 210 and has a reverse side 205, which is opposite to the face side 202, affixed to the adhesive tape 209. Therefore, the workpiece 200 placed in the opening of the annular frame 210 is supported on the annular frame 210 by the adhesive tape 209. The workpiece 200 will be cut along the projected dicing lines 203 into individual device chips having the respective devices 204, by the processing apparatus 100. According to the present invention, the workpiece 200 may alternatively be a rectangular packaged substrate having a plurality of resin-encapsulated devices, a ceramic plate, a glass plate, or the like.

According to the present embodiment, the cutting apparatus represented by the processing apparatus 100 has a cutting blade 121 for cutting the workpiece 200 held on the holding table 1, along the projected dicing lines 203, dividing the workpiece 200 into individual device chips having the respective devices 204. As illustrated in FIG. 1, the processing apparatus 100 includes the holding table 1 for holding the workpiece 200 under suction on a holding surface 21 thereof, a cutting unit 120 functioning as a processing unit for cutting the workpiece 200 held on the holding table 1, an image capturing unit 130 for capturing an image of the workpiece 200 held on the holding table 1, and a controller 160.

Further, the processing apparatus 100 includes a moving unit 140 for moving the holding table 1 and the cutting unit 120 relatively to each other. Specifically, the moving unit 140 includes at least a processing feed unit 141 for processing-feeding the holding table 1 along an X-axis parallel to horizontal directions, an indexing feed unit 142 for indexing-feeding the cutting unit 120 along a Y-axis parallel to horizontal directions and perpendicular to the X-axis, an incising feed unit 143 for incising-feeding the cutting unit 120 along a Z-axis parallel to vertical directions and perpendicular to the X-axis and the Y-axis, and a rotating unit 144 for rotating the holding table 1 about a central axis thereof parallel to the Z-axis. Stated otherwise, the moving unit 140 moves the holding table 1 and the cutting unit 120 relatively to each other along the X-axis, the Y-axis, and the Z-axis and about the central axis of the holding table 1.

The processing feed unit 141 moves the cutting unit 120 and the holding table 1 relatively to each other along the X-axis by moving the holding table 1 and the rotating unit 144 along the X-axis parallel to horizontal directions as processing feed directions. The indexing feed unit 142 moves the cutting unit 120 and the holding table 1 relatively to each other along the Y-axis by moving the cutting unit 120 along the Y-axis parallel to horizontal directions as indexing feed directions and perpendicular to the X-axis.

The incising feed unit 143 moves the cutting unit 120 and the holding table 1 relatively to each other along the Z-axis by moving the cutting unit 120 along the Z-axis parallel to vertical directions as incising feed directions and perpendicular to the X-axis and the Y-axis. The rotating unit 144 is supported on the processing feed unit 141 and supports the holding table 1, so that the rotating unit 144 is movable along the X-axis in unison with the holding table 1. The rotating unit 144 rotates the holding table 1 about the central axis thereof parallel to the Z-axis.

Each of the processing feed unit 141, the indexing feed unit 142, and the incising feed unit 143 includes a known ball screw rotatable about its central axis, a known electric motor for rotating the ball screw about the central axis thereof, and a pair of guide rails supporting thereon the holding table 1 or the cutting unit 120 for sliding movement along the X-axis, the Y-axis, or the Z-axis. The rotating unit 144 includes an electric motor for rotating the holding table 1 about its central axis.

The holding table 1 holds the workpiece 200 under suction on the holding surface 21. The holding table 1 is rotated about its central axis parallel to the Z-axis by the rotating unit 144. The rotating unit 144 and the holding table 1 are moved along the X-axis by the processing feed unit 141. A plurality of clamps 4 for clamping the annular frame 210 are disposed circumferentially around the holding table 1. Structural details of the holding table 1 will be described later.

The cutting unit 120 functioning as the processing unit cuts the workpiece 200 held on the holding table 1, with the cutting blade 121 mounted on a spindle 123. The cutting unit 120 is movable along the Y-axis with respect to the workpiece 200 held on the holding table 1, by the indexing feed unit 142, and is also movable along the Z-axis with respect to the workpiece 200 held on the holding table 1, by the incising feed unit 143. As illustrated in FIG. 1, the cutting unit 120 is supported on a support frame 102 erected on an apparatus base 101, by the indexing feed unit 142 and the incising feed unit 143. The cutting unit 120 has the cutting blade 121 positionable in a desired position on the holding surface 21 of the holding table 1 by the indexing feed unit 142 and the incising feed unit 143.

The cutting unit 120 includes the cutting blade 121, a spindle housing 122 movable along the Y-axis and the Z-axis by the indexing feed unit 142 and the incising feed unit 143, the spindle 123 rotatably mounted in the spindle housing 122 and supporting the cutting blade 121 mounted on a distal end thereof, a spindle motor, not illustrated, for rotating the spindle 123 about a central axis thereof, and a cutting water supply nozzle 124 for supplying cutting wafer to the cutting blade 121.

The cutting blade 121 is a substantially ring-shaped ultrathin cutting grindstone. The cutting blade 121 is fixed to the distal end of the spindle 123. According to the present embodiment, the cutting blade 121 is in the form of a hub blade including a circular base and an annular cutting edge mounted on an outer edge of the circular base and configured to cut the workpiece 200. The cutting edge is made of abrasive grains of SiC, alumina, diamond, cubic boron nitride (CBN), or the like that are bonded together by a bonding material or binder of metal, resin, or the like. The cutting edge has a predetermined thickness. According to the present invention, the cutting blade 121 may alternatively be what is called a washer blade including a cutting edge only. The cutting blade 121 and the spindle 123 of the cutting unit 120 have their central axes parallel to the Y-axis.

The image capturing unit 130 is fixed to the cutting unit 120 for movement in unison therewith. The image capturing unit 130 includes an image capturing device for capturing an image of an area of the workpiece 200 to be divided that is held on the holding table 1 and that is yet to be cut by the cutting unit 120. The image capturing device is, for example, a CCD image sensor or a CMOS image sensor. The image capturing unit 130 captures an image of the workpiece 200 held on the holding table 1, for use in an alignment step for positionally aligning the workpiece 200 and the cutting blade 121 with each other, and outputs the captured image to the controller 160.

The processing apparatus 100 also includes an X-axis position detecting unit, not illustrated, for detecting the position of the holding table 1 along the X-axis, a Y-axis position detecting unit, not illustrated, for detecting the position of the cutting unit 120 along the Y-axis, and a Z-axis position detecting unit, not illustrated, for detecting the position of the cutting unit 120 along the Z-axis. Each of the X-axis position detecting unit and the Y-axis position detecting unit includes a linear scale extending parallel to the X-axis or the Y-axis and a reading head for reading markings on the linear scale to detect the position of the holding table 1 along the X-axis or the position of the cutting unit 120 along the Y-axis. The Z-axis position detecting unit detects the position of the cutting unit 120 along the Z-axis from electric signal pulses applied to the electric motor of the incising feed unit 143. The X-axis position detecting unit, the Y-axis position detecting unit, and the Z-axis position detecting unit output signals representing the detected position of the holding table 1 along the X-axis, the detected position of the lower end of the cutting edge of the cutting unit 120 along the Y-axis, and the detected position of the lower end of the cutting edge of the cutting unit 120 along the Z-axis, respectively, to the controller 160.

According to the present embodiment, the positions of the holding table 1 and the cutting unit 120 along the X-axis, the Y-axis, and the Z-axis are determined on the basis of predetermined reference positions, not illustrated.

The controller 160 controls the components of the processing apparatus 100 to enable the processing apparatus 100 to perform a processing operation on the workpiece 200. The controller 160 is a computer that includes a processing device having a microprocessor such as a central processing unit (CPU), a storage device having a memory such as a read only memory (ROM) or a random access memory (RAM), and an input/output interface device. The processing device of the controller 160 performs processing sequences according to computer programs stored in the storage device, and generates and outputs control signals for controlling the processing apparatus 100, via the input/output interface device to the components of the processing apparatus 100.

The controller 160 is electrically connected to a display unit, not illustrated, such as a liquid crystal display device for displaying states and images of processing operations, an input unit, not illustrated, used by an operator to register processing content information, and a signaling unit, not illustrated, for signaling to the operator. The input unit includes a touch panel incorporated in the display unit. The signaling unit issues at least either sound or light to signal to the operator.

As illustrated in FIGS. 2 and 3, the holding table 1 includes a holder 2 shaped as a circular plate that provides the holding surface 21 for holding the workpiece 200 under suction thereon, and a base 3 surrounding an outer circumferential edge of the holder 2. The holder 2 is made of porous ceramic as a porous material, so that the holding table 1 can be referred to as what is called a porous chuck table.

According to the present embodiment, the base 3 is made of a metal material such as stainless steel and shaped as a thick circular plate. As illustrated in FIG. 3, the base 3 includes a circular plate 31 larger in diameter than the workpiece 200 and an annular ridge 32 formed integrally with and protruding upwardly from an outer edge of the circular plate 31. Therefore, the base 3 has an upwardly open cavity 33 defined centrally therein by the circular plate 31 and the annular ridge 32. The circular plate 31 and the annular ridge 32 are disposed coaxially with each other and combined integrally with each other.

The cavity 33 is of a circular shape as viewed in plan and is larger in diameter than the workpiece 200. The cavity 33 is disposed coaxially with the circular plate 31 and the annular ridge 32. The cavity 33 has a bottom surface 34 including a lower bottom surface portion 341 disposed centrally and a higher bottom surface portion 342 surrounding the lower bottom surface portion 341 and lying closer to an upper surface 321 of the annular ridge 32 than the lower bottom surface portion 341.

The circular plate 31 of the base 3 is disposed on the rotating unit 144. The base 3 has a suction channel 35 that is defined therein and that extends axially through the circular plate 31. The suction channel 35 is open upwardly at the lower bottom surface portion 341 and is fluidly connected to a suction source 5 such as an ejector through an on-off valve 36. The holder 2 is fitted in the cavity 33 and has an outer edge surrounded by the annular ridge 32 of the base 3. With the holder 2 fitted in the cavity 33, the holder 2 is held in contact with the higher bottom surface portion 342, leaving a space between the holder 2 and the lower bottom surface portion 341, and the upper surface 321 of the annular ridge 32 lies flush with the holding surface 21. When the suction source 5 is actuated and the on-off valve 36 is opened, a negative pressure or suction force from the suction source 5 is transmitted through the on-off valve 36 and the suction channel 35 to the space between the holder 2 and the lower bottom surface portion 341, acting on the holder 2 fitted in the cavity 33.

The holder 2 is larger in diameter than the workpiece 200 and equal in diameter to the annular ridge 32, i.e., the cavity 33. Since the holder 2 is made of porous ceramic, as described above, the holder 2 has a multiplicity of pores contained therein. The holder 2 is fixedly fitted in the cavity 33 by having its lower surface 22 bonded to the higher bottom surface portion 342 by an adhesive, not illustrated. The holder 2 has an upper surface that functions as the holding surface 21 of the holding table 1 for holding the workpiece 200 under suction thereon. The holder 2 that is fixed to the base 3 has the holding surface 21 ground into a flat surface parallel to the horizontal directions. The holding surface 21 provided by the upper surface of the holder 2 lies flush with the upper surface 321 of the annular ridge 32.

The holder 2 is fluidly connected to the suction source 5 via the suction channel 35 extending through the base 3. When the suction source 5 is actuated and the on-off valve 36 is opened, the negative pressure transmitted from the suction source 5 to the space between the holder 2 and the lower bottom surface portion 341 acts through the pores in the holder 2 to the holding surface 21, which attracts and holds the workpiece 200 under suction.

According to the present embodiment, the total volume of the pores in the holder 2 takes up 40% of the entire volume of the holder 2. According to the present invention, however, the ratio of the total volume of the pores in the holder 2 to the entire volume of the holder 2 is not limited to 40%.

The holder 2 includes a solid part, except the pores, that contains an oxide semiconductor. According to the present embodiment, the oxide semiconductor contained in the solid part except the pores of the holder 2 is in the range of 3% by volume to 20% by volume in terms of a blending ratio. Specifically, according to the present embodiment, providing the total volume of the solid part except the pores of the holder 2 is 100%, the oxide semiconductor contained in the solid part is in the range of 3% by volume to 20% by volume. According to the present embodiment, the oxide semiconductor contained in the solid part includes tin oxide (also referred to as tin dioxide), titanium oxide, nickel oxide, or zinc oxide. According to the present invention, the oxide semiconductor contained in the solid part of the holder 2 may include at least any of tin oxide (also referred to as tin dioxide), titanium oxide, nickel oxide, or zinc oxide.

According to the present embodiment, providing the total volume of the solid part except the pores of the holder 2 is 100%, as the blending ratio of the oxide semiconductor contained in the solid part is in the range of 3% by volume to 20% by volume, the holder 2 has a volume resistivity in the range of $1\times10^{-8}$ to $1\times10^{-6}$ Ω·m. If the volume resistivity exceeds $1\times10^{-6}$ Ω·m, then the devices 204 on the workpiece 200 held on the holding surface 21 tend to suffer electrostatic breakdown, and if the volume resistivity is smaller than $1\times10^{-8}$ Ω·m, then the blending ratio of the oxide semiconductor is too high for the holder 2 to achieve a predetermined level of mechanical strength. Therefore, the volume resistivity of the holder 2 should desirably be in the range of $1\times10^{-8}$ to $1\times10^{-6}$ Ω·m.

According to the present embodiment, if the holder 2 contains tin oxide as the oxide semiconductor, then the holder 2 also contains SiC and glass frit in addition to tin oxide as the solid part. In this case, providing the total volume of the solid part except the pores of the holder 2 is 100%, it is desirable that the blending ratio of tin oxide be in the range of 3% by volume to 10% by volume, the blending ratio of SiC be in the range of 70% by volume to 77% by volume, and the blending ratio of glass frit be 20% by volume.

According to the present embodiment, if the holder 2 contains titanium oxide as the oxide semiconductor, then the holder 2 also contains aluminum oxide (also referred to as alumina) in addition to titanium oxide as the solid part. In this case, providing the total volume of the solid part except the pores of the holder 2 is 100%, it is desirable that the blending ratio of titanium oxide be in the range of 10% by volume to 20% by volume and that the blending ratio of aluminum oxide be in the range of 80% by volume to 90% by volume.

According to the present embodiment, if the holder 2 contains nickel oxide as the oxide semiconductor, then the holder 2 also contains aluminum oxide (also referred to as alumina) in addition to nickel oxide as the solid part. In this case, providing the total volume of the solid part except the pores of the holder 2 is 100%, it is desirable that the blending ratio of nickel oxide be in the range of 10% by volume to 20% by volume and that the blending ratio of aluminum oxide be in the range of 80% by volume to 90% by volume.

According to the present embodiment, if the holder 2 contains zinc oxide as the oxide semiconductor, then the holder 2 also contains aluminum oxide (also referred to as alumina) in addition to zinc oxide as the solid part. In this case, providing the total volume of the solid part except the pores of the holder 2 is 100%, it is desirable that the blending ratio of zinc oxide be in the range of 10% by volume to 20% by volume and that the blending ratio of aluminum oxide be in the range of 80% by volume to 90% by volume.

The processing apparatus 100 performs a processing operation as follows. The processing apparatus 100 holds the reverse side 205 of the workpiece 200 placed on the holding surface 21 of the holding table 1, under suction on the holding surface 21 of the holding table 1 with the adhesive tape 209 interposed therebetween, and clamps the annular frame 210 with the clamps 4. The processing apparatus 100 enables the processing feed unit 141 and the indexing feed unit 142 to move the holding table 1 and the cutting unit 120, and enables the image capturing unit 130 to capture an image of the workpiece 200 on the holding table 1 and to perform the alignment step for positionally aligning the workpiece 200 and the cutting blade 121 with each other on the basis of the captured image.

The processing apparatus 100 supplies cutting water from the cutting water supply nozzle 124, and while moving the holding table 1 and the cutting blade 121 relatively to each other along the projected dicing lines 203, the processing apparatus 100 enables the cutting blade 121 to cut into the workpiece 200 along the projected dicing lines 203, one at a time, until the cutting blade 121 reaches the adhesive tape 209, thereby cutting the workpiece 200 along the projected dicing lines 203. When the processing apparatus 100 has cut the workpiece 200 along all the projected dicing lines 203, thereby dividing the workpiece 200 into individual device chips including the respective devices 204, the processing apparatus 100 finishes the processing operation.

Figure 4:
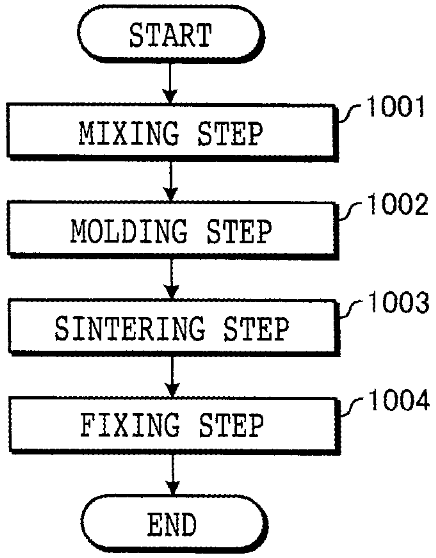
FIG. 4 is a flow chart of the sequence of a method of manufacturing the holding table illustrated in FIG. 2.
Figure 5:
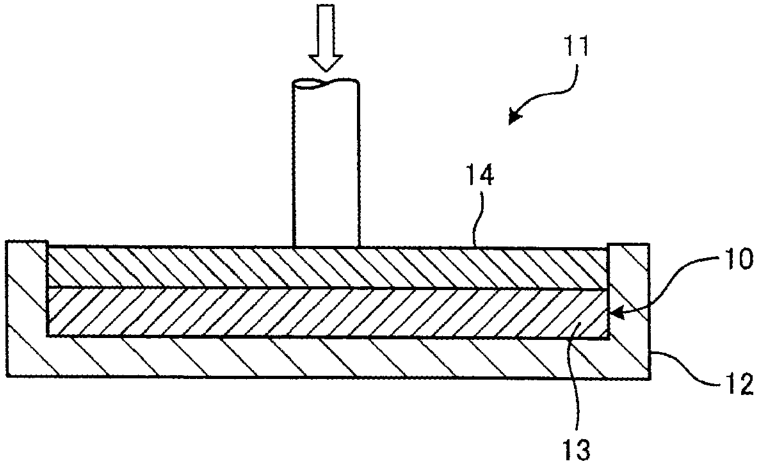
FIG. 5 is a cross-sectional view schematically illustrating a molding step of the method of manufacturing the holding table illustrated in FIG. 4.
Figure 6:
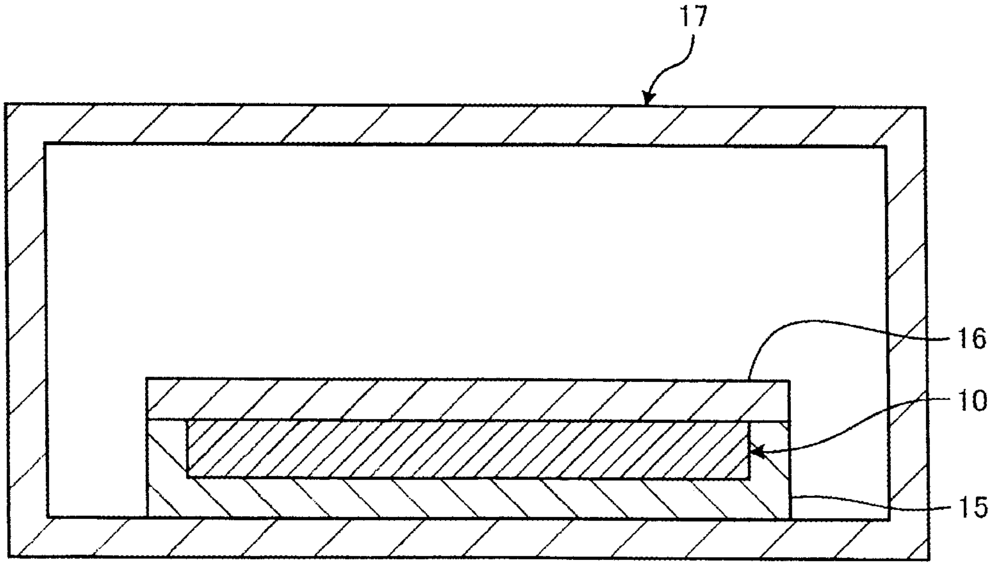
FIG. 6 is a cross-sectional view schematically illustrating a sintering step of the method of manufacturing the holding table illustrated in FIG. 4.
Figure 7:
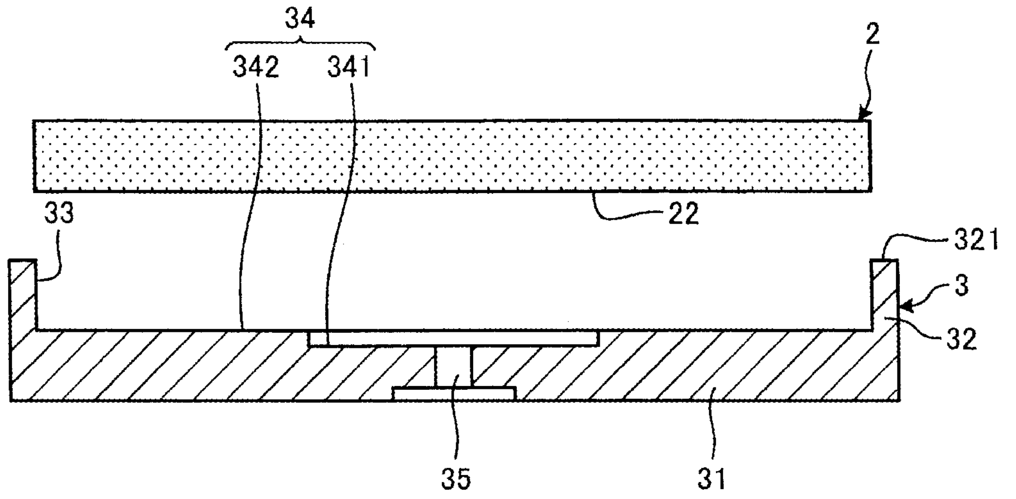
FIG. 7 is a cross-sectional view schematically illustrating a fixing step of the method of manufacturing the holding table illustrated in FIG. 4.

A method of manufacturing a holding table according to the present embodiment will be described below with reference to the drawings. FIG. 4 is a flow chart of the sequence of the method of manufacturing the holding table illustrated in FIG. 2. FIG. 5 schematically illustrates, in cross section, a molding step of the method of manufacturing the holding table illustrated in FIG. 4. FIG. 6 schematically illustrates, in cross section, a sintering step of the method of manufacturing the holding table illustrated in FIG. 4. FIG. 7 schematically illustrates, in cross section, a fixing step of the method of manufacturing the holding table illustrated in FIG. 4.

The method of manufacturing a holding table according to the present embodiment is a method of manufacturing the holding table 1 described above and includes at least a mixing step 1001, a molding step 1002, a sintering step 1003, and a fixing step 1004.

(Mixing Step)

The mixing step 1001 is a step of producing a mixture of the materials of the solid part of the holder 2. In the mixing step 1001, the materials of the solid part are mixed together, producing a mixture.

(Molding Step)

The molding step 1002 is a step of molding the mixture into a plate-shaped object 10 (see FIG. 5) that is commensurate in shape with the holder 2. In the molding step 1002, according to the present embodiment, as illustrated in FIG. 5, the mixture is introduced into a cavity 13 in a mold 12 of a compression molding apparatus 11. Then, a plate-shaped presser 14 presses the mixture in the cavity 13, compressing molding the mixture into the plate-shaped object 10. Then, the plate-shaped object 10 is removed from the mold 12.

(Sintering Step)

The sintering step 1003 is a step of sintering the molded plate-shaped object 10 into the holder 2. In the sintering step 1003, according to the present embodiment, as illustrated in FIG. 6, the plate-shaped object 10 is placed in a receptacle 15, and then, the receptacle 15 is sealed by a lid 16. Thereafter, the receptacle 15 with the plate-shaped object 10 housed therein is placed in a sintering furnace 17. Then, the plate-shaped object 10 is heated to a predetermined high temperature in the sintering furnace 17 for a predetermined period of time. The plate-shaped object 10 is now sintered into the holder 2. The plate-shaped object 10 may be sintered without being housed in the receptacle 15. If the plate-shaped object 10 is not housed in the receptacle 15 in the sintering step 1003, then the plate-shaped object 10 may be sintered while being kept in place by a plate put thereon as a weight or by a pair of plates sandwiching the plate-shaped object 10 therebetween.

(Fixing Step)

The fixing step 1004 is a step of fixing the holder 2 to the base 3. In the fixing step 1004, according to the present embodiment, as illustrated in FIG. 7, the holder 2 is housed in the cavity 33 in the base 3, and fixed to the higher bottom surface portion 342 in the cavity 33 by an adhesive, not illustrated, thereby producing the holding table 1. After the fixing step 1004, the holding surface 21 of the holding table 1 is ground into a flat surface parallel to the horizontal directions. Thereafter, the holding table 1 is installed in the processing apparatus 100 and will be used to process the workpiece 200.

As described above, since the holder 2 of the holding table 1 according to the present embodiment contains an oxide semiconductor, the holder 2 is less liable to reduce its electric conductivity than the holder containing metal particles, when sintered in the atmosphere. As a result, the holder 2 can have its resistivity reduced to a desired value when sintered in the atmosphere, making it possible to keep the workpiece 200 held thereon from less electrostatically chargeable.

Moreover, the holder 2 of the holding table 1 according to the present embodiment has a volume resistivity in the range of $1\times10^{-8}$ to $1\times10^{-6}$ Ω·m, and the oxide semiconductor is in the range of 3% by volume to 20% by volume in terms of a blending ratio. Therefore, the holder 2 can secure a desired level of mechanical strength while making it possible to reduce its resistivity to a desired value even when sintered in the atmosphere.

The inventor of the present invention has confirmed the advantages of the holding table 1 according to the present embodiment by way of experimentation. The results of the experiments are illustrated in Table 1 below.

TABLE 1

| | Volume resistivity | Mechanical strength |
|---|---|---|
| Comparative Example 1 | x | ○ |
| Comparative Example 2 | x | ○ |
| Comparative Example 3 | x | ○ |
| Comparative Example 4 | x | ○ |
| Inventive Item 1 | ○ | ○ |
| Inventive Item 2 | ○ | ○ |
| Inventive Item 3 | ○ | ○ |
| Inventive Item 4 | ○ | ○ |
| Inventive Item 5 | ○ | ○ |
| Inventive Item 6 | ○ | ○ |
| Inventive Item 7 | ○ | ○ |
| Inventive Item 8 | ○ | ○ |
| Comparative Example 5 | ○ | x |
| Comparative Example 6 | ○ | x |
| Comparative Example 7 | ○ | x |
| Comparative Example 8 | ○ | x |

In the experiments, holders 2 having different solid parts were fabricated as Comparative Examples 1 through 8 and Inventive Items 1 through 8, and the volume resistivity of the holders 2 as Comparative Examples 1 through 8 and Inventive Items 1 through 8 and the mechanical strength of the holders 2 as Comparative Examples 1 through 8 and Inventive Items 1 through 8 were measured. The total volume of the pores in each of the holders 2 as Comparative Examples 1 through 8 and Inventive Items 1 through 8 was 40% of the entire volume of the holder 2.

The holder 2 according to Comparative Example 1 contained tin oxide as the oxide semiconductor. Providing the total volume of the solid part except the pores of the holder 2 was 100%, the blending ratio of tin oxide was 2% by volume, the blending ratio of SiC is 78% by volume, and the blending ratio of glass frit was 20% by volume.

The holder 2 according to Comparative Example 2 contained titanium oxide as the oxide semiconductor. Providing the total volume of the solid part except the pores of the holder 2 was 100%, the blending ratio of titanium oxide was 5% by volume, and the blending ratio of oxide aluminum was 95% by volume.

The holder 2 according to Comparative Example 3 contained nickel oxide as the oxide semiconductor. Providing the total volume of the solid part except the pores of the holder 2 was 100%, the blending ratio of nickel oxide was 5% by volume, and the blending ratio of oxide aluminum was 95% by volume.

The holder 2 according to Comparative Example 4 contained zinc oxide as the oxide semiconductor. Providing the total volume of the solid part except the pores of the holder 2 was 100%, the blending ratio of zinc oxide was 5% by volume, and the blending ratio of oxide aluminum was 95% by volume.

The holder 2 according to Inventive Item 1 contained tin oxide as the oxide semiconductor. Providing the total volume of the solid part except the pores of the holder 2 was 100%, the blending ratio of tin oxide was 3% by volume, the blending ratio of SiC was 77% by volume, and the blending ratio of glass frit was 20% by volume.

The holder 2 according to Inventive Item 2 contained titanium oxide as the oxide semiconductor. Providing the total volume of the solid part except the pores of the holder 2 was 100%, the blending ratio of titanium oxide was 10% by volume, and the blending ratio of oxide aluminum was 90% by volume.

The holder 2 according to Inventive Item 3 contained nickel oxide as the oxide semiconductor. Providing the total volume of the solid part except the pores of the holder 2 was 100%, the blending ratio of nickel oxide was 10% by volume, and the blending ratio of oxide aluminum was 90% by volume.

The holder 2 according to Inventive Item 4 contained zinc oxide as the oxide semiconductor. Providing the total volume of the solid part except the pores of the holder 2 was 100%, the blending ratio of zinc oxide was 10% by volume, and the blending ratio of oxide aluminum was 90% by volume.

The holder 2 according to Inventive Item 5 contained tin oxide as the oxide semiconductor. Providing the total volume of the solid part except the pores of the holder 2 was 100%, the blending ratio of tin oxide was 10% by volume, the blending ratio of SiC was 70% by volume, and the blending ratio of glass frit was 20% by volume.

The holder 2 according to Inventive Item 6 contained titanium oxide as the oxide semiconductor. Providing the total volume of the solid part except the pores of the holder 2 was 100%, the blending ratio of titanium oxide was 20% by volume, and the blending ratio of oxide aluminum was 80% by volume.

The holder 2 according to Inventive Item 7 contained nickel oxide as the oxide semiconductor. Providing the total volume of the solid part except the pores of the holder 2 was 100%, the blending ratio of nickel oxide was 20% by volume, and the blending ratio of oxide aluminum was 80% by volume.

The holder 2 according to Inventive Item 8 contained zinc oxide as the oxide semiconductor. Providing the total volume of the solid part except the pores of the holder 2 was 100%, the blending ratio of zinc oxide was 20% by volume, and the blending ratio of oxide aluminum was 80% by volume.

The holder 2 according to Comparative Example 5 contained tin oxide as the oxide semiconductor. Providing the total volume of the solid part except the pores of the holder 2 was 100%, the blending ratio of tin oxide was 15% by volume, the blending ratio of SiC is 65% by volume, and the blending ratio of glass frit was 20% by volume.

The holder 2 according to Comparative Example 6 contained titanium oxide as the oxide semiconductor. Providing the total volume of the solid part except the pores of the holder 2 was 100%, the blending ratio of titanium oxide was 25% by volume, and the blending ratio of oxide aluminum was 75% by volume.

The holder 2 according to Comparative Example 7 contained nickel oxide as the oxide semiconductor. Providing the total volume of the solid part except the pores of the holder 2 was 100%, the blending ratio of nickel oxide was 25% by volume, and the blending ratio of oxide aluminum was 75% by volume.

The holder 2 according to Comparative Example 8 contained zinc oxide as the oxide semiconductor. Providing the total volume of the solid part except the pores of the holder 2 was 100%, the blending ratio of zinc oxide was 25% by volume, and the blending ratio of oxide aluminum was 75% by volume.

In Table 1, those holders 2 that had a volume resistivity in the range of $1\times10^{-8}$ to $1\times10^{-6}$ Ω·m are indicated by a circle, and those holders 2 that had a volume resistivity in excess of $1\times10^{-6}$ Ω·m are indicated by a cross. In Table 1, in addition, those holders 2 that had achieved a predetermined level of mechanical strength are indicated by a circle, and those holders 2 that had not achieved the predetermined level of mechanical strength are indicated by a cross.

Table 1 indicates that, according to Comparative Examples 1 through 4, the volume resistivity exceeded $1\times10^{-6}$ Ω·m, making it difficult to lower the resistivity to a desired value, and the workpiece 200 tended to be electrostatically charged, possibly resulting in electrostatic breakdown of the devices 204. According to Inventive Items 1 through 8 and Comparative Examples 5 through 8, by contrast, even when the holders 2 were sintered in the atmosphere, the volume resistivity was kept in the range of $1\times10^{-8}$ to $1\times10^{-6}$ Ω·m, and the workpiece 200 was restrained from being electrostatically charged, preventing electrostatic breakdown of the devices 204.

Table 1 also reveals that Comparative Examples 5 through 8 did not achieve the predetermined level of mechanical strength. By contrast, Inventive Items 1 through 8 and Comparative Examples 1 through 4 achieved the predetermined level of mechanical strength.

Therefore, it is clear from Table 1 that, by setting the blending ratio of the oxide semiconductor in the range of 3% by volume to 20% by volume, even when the holder 2 is sintered in the atmosphere, the volume resistivity is kept in the range of $1\times10^{-8}$ to $1\times10^{-6}$ Ω·m, the workpiece 200 is restrained from being electrostatically charged, preventing electrostatic breakdown of the devices 204, and the holder 2 achieves the predetermined level of mechanical strength.

It is also clear from Table 1 that, by setting the blending ratio of tin oxide in the range of 3% by volume to 10% by volume, even when the holder 2 is sintered in the atmosphere, the volume resistivity is kept in the range of $1\times10^{-8}$ to $1\times10^{-6}$ Ω·m, the workpiece 200 is restrained from being electrostatically charged, preventing electrostatic breakdown of the devices 204, and the holder 2 achieves the predetermined level of mechanical strength.

It is also clear from Table 1 that, by setting the blending ratio of titanium oxide in the range of 10% by volume to 20% by volume, even when the holder 2 is sintered in the atmosphere, the volume resistivity is kept in the range of $1\times10^{-8}$ to $1\times10^{-6}$ Ω·m, the workpiece 200 is restrained from being electrostatically charged, preventing electrostatic breakdown of the devices 204, and the holder 2 achieves the predetermined level of mechanical strength.

It is also clear from Table 1 that, by setting the blending ratio of nickel oxide in the range of 10% by volume to 20% by volume, even when the holder 2 is sintered in the atmosphere, the volume resistivity is kept in the range of $1\times10^{-8}$ to $1\times10^{-6}$ Ω·m, the workpiece 200 is restrained from being electrostatically charged, preventing electrostatic breakdown of the devices 204, and the holder 2 achieves the predetermined level of mechanical strength.

It is also clear from Table 1 that, by setting the blending ratio of zinc oxide in the range of 10% by volume to 20% by volume, even when the holder 2 is sintered in the atmosphere, the volume resistivity is kept in the range of $1\times10^{-8}$ to $1\times10^{-6}$ Ω·m, the workpiece 200 is restrained from being electrostatically charged, preventing electrostatic breakdown of the devices 204, and the holder 2 achieves the predetermined level of mechanical strength.

The present invention is not limited to the embodiment described above. Various many changes and modifications may be made therein without departing from the scope of the invention. According to the present invention, for example, the processing apparatus 100 is not limited to a cutting apparatus for cutting the workpiece 200, and may be a laser processing apparatus for processing the workpiece 200 with a laser beam applied thereto, a grinding apparatus for grinding the workpiece 200, a polishing apparatus for polishing the workpiece 200, a single-point cutting apparatus for cutting the workpiece 200 with a single-point cutting tool, an expanding apparatus for expanding an expansion tape affixed to the workpiece 200, to divide the workpiece 200 into individual device chips including the respective devices 204 from rupture-initiating points represented by modified layers formed in the workpiece 200, a cleaning apparatus for washing away a water-soluble protective film on the face side 202 of the workpiece 200 after the workpiece 200 has been processed by a laser beam, or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An apparatus for processing a workpiece comprising:

a base having a circular cavity defined therein, wherein the base includes an annular ridge around the circular cavity; and a holder fitted in the circular cavity in the base, such that the annular ridge of the base surrounds the holder, wherein the holder contains porous ceramic and an oxide semiconductor, such that the holder contains therein a plurality of pores, wherein the holder is configured and arranged to be connected to a suction source such that a negative pressure transmitted from the suction source acts through the pores in the holder to attract and hold the workpiece under suction on a holding surface of the holder, wherein the oxide semiconductor has a blending ratio in a range of 3% by volume to 20% by volume.

2. The apparatus for processing a workpiece according to claim 1, wherein: the holder has a volume resistivity in a range of $1\times10^{-8}$ to $1\times10^{-6}$ Ω·m.

3. The apparatus for processing a workpiece according to claim 1, wherein:

the oxide semiconductor includes at least any of tin oxide, titanium oxide, nickel oxide, or zinc oxide.

4. The apparatus for processing a workpiece according to claim 3, wherein:

the oxide semiconductor includes the tin oxide, and the tin oxide has a blending ratio in a range of 3% by volume to 10% by volume.

5. The apparatus for processing a workpiece according to claim 3, wherein:

the oxide semiconductor includes the titanium oxide or the nickel oxide, and the titanium oxide or the nickel oxide has a blending ratio in a range of 10% by volume to 20% by volume.

6. The apparatus for processing a workpiece according to claim 3, wherein the holding surface of the holder aligns flush with an upper surface of the annular ridge of the base.

* * * * *